United States Patent
Cong et al.

(10) Patent No.: US 6,408,427 B1
(45) Date of Patent: Jun. 18, 2002

(54) WIRE WIDTH PLANNING AND PERFORMANCE OPTIMIZATION FOR VLSI INTERCONNECTS

(75) Inventors: Jingsheng Cong, Pacific Palisades; Zhigang Pan, Los Angeles, both of CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/510,068

(22) Filed: Feb. 22, 2000

(51) Int. Cl.[7] .............................................. G06F 17/50
(52) U.S. Cl. ............................................. 716/13; 716/2
(58) Field of Search ............................ 716/1, 2, 12, 13

(56) References Cited

U.S. PATENT DOCUMENTS 5,793,643 A * 8/1998 Cai .............................. 364/391
5,841,333 A   11/1998 Fishburn et al. ............ 333/238

OTHER PUBLICATIONS

C.P. Chen et al., Optimal wire–sizing formula under the Elmore delay model, in Proc. Design Automation Conf., pp. 487–490, 1996.

C.P. Chen et al., Optimal wire sizing function with fringing capacitance consideration, in Proc. Design Automation Conf., pp. 604–607, 1997.

J. Cong et al., Interconnect design for deep submicron ICs, in Proc. Int. Conf. on Computer Aided Design, pp. 478–485, 1997.

J. Cong et al., Optimal wiresizing under the distributed Elmore delay model, in Proc. Conf. on Computer Aided Design, pp. 634–639, 1993.

J. Cong et al., Interconnect estimation and planning for deep submicron designs, in Proc. Design Automation Conf., pp. 507–510, 1999.

J. Cong et al., Global interconnect sizing and spacing with consideration of coupling capacitance, in Proc. Int. Conf. on Computer Aided Design, pp. 623–633, 1997.

Semiconductor Industry Association, National Technology Roadmap for Semiconductors, 1997, pp. 1–196, no other name.

J. Davis et al., Is Interconnect the weak link?, in IEEE Circuits and Devices Magazine, vol. 14, No. 2, pp. 30–36, 1998.

R. Otten et al., Planning for performance, in Proc. Design Automation Conf., pp. 122–127, Jun. 1998.

P. Fisher et al., The test of time clock–cycle estimation and test challenges for future microprocessors, IEEE Circuits and Devices Magazines, vol. 14, pp. 37–44, Mar. 1998.

J. Davis et al., A stochastic wire–length distribution for gigascale integration (GSI) i. derivation and validation, IEEE Transactions on Electron Devices, vol. 45, No. 3, pp. 580–589, 1998.

\* cited by examiner

Primary Examiner—Matthew Smith
Assistant Examiner—Leigh Marie Garbowski
(74) Attorney, Agent, or Firm—Gates & Cooper LLP

(57) ABSTRACT

The present invention discloses a method, apparatus, and article of manufacture for wire width planning and performance optimization for very large scale integration (VLSI) interconnects. Two simplified wire sizing schemes are described for the VLSI interconnect, namely a single-width sizing (1-WS) or a two-width sizing (2-WS). These simplified wire sizing schemes have near optimal performance as compared to more complex wire sizing schemes with many or even an infinite number of wire widths. A wire width planning method is then described to determine a small set of globally optimal wire widths for the VLSI interconnects in a range of lengths. It is concluded that near optimal interconnect performance can be achieved by using such pre-designed, limited number of wire widths (usually two-width design is adequate). The layout for the VLSI interconnects is then generated and optimized using the limited number of wire widths.

68 Claims, 7 Drawing Sheets

US 6,408,427 B1

WIRE WIDTH PLANNING AND PERFORMANCE OPTIMIZATION FOR VLSI INTERCONNECTS

BACKGROUND OF TEE INVENTION

1. Field of the Invention

The present invention relates generally to electronic design automation (EDA) systems, and in particular, to a method, apparatus, and article of manufacture for wire width planing and performance optimization for very large scale integration (VLSI) interconnects.

2. Description of the Related Art (Note: This application references a number of different publications as indicated throughout the specification by reference numbers enclosed in brackets, e.g., [x]. A list of these different publications ordered according to these reference numbers can be found below in Section 7 of the "Detailed Description of the Preferred Embodiment". Each of these publications is incorporated by reference herein.)

For deep submicron (DSM) designs of VLSI circuits, wiring delay has exceeded transistor delays, and thus has become the dominant factor in determining overall circuit performance [12, 3]. To achieve minima wire delay, a number of techniques have been introduced for optical wire sizing, by using continuous wire shaping [9, 1, 2] or discrete wire tapering with many discrete wire widths [5, 4, 3] in an interconnect structure to optimize the interconnect performance. These techniques, however, will considerably complicate the layout design, especially the detailed routing, due to their use of possibly large number of different wire widths. Moreover, it is difficult to plan and allocate proper routing resources at design planning stages for these wire sizing optimizations, which is necessary to achieve the overall design and timing convergence.

Thus, there is a need in the art for simplified wire sizing schemes. Moreover, there is a need in the art for wire width planning and optimization for VLSI interconnect performance optimization.

SUMMARY OF THE INVENTION

To address the requirements described above, the present invention discloses a method, apparatus, and article of manufacture for wire width planning and optimization for VLSI interconnect performance optimization. Two simplified wire sizing schemes are described for an interconnect structure, namely the single-width sizing method (1-WS) and the two-width sizing method (2-WS). These simplified wire sing schemes have near optimal performance as compared to complex wire sizing methods with many or even an infinite number of wire widths. A wire width planning method is then described to determine a small set of globally optimal wire widths for VLSI interconnects in a range of lengths. It is concluded that near optimal interconnect performance can be achieved by using such a pre-designed, very limited number of wire widths (usually two-width design is adequate). The layout for the VLSI interconnects is then generated and optimized using the limited number of planned wire widths. As a result, the resulting layout is greatly simplified.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Figure 1:
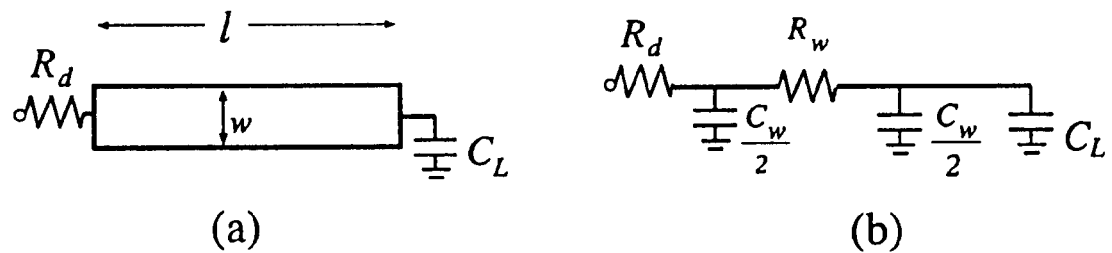
FIGS. 1(a) and (b) illustrate a single-width sizing according to the preferred embodiment of the present invention, and its modeling by a RC circuit.

In the following description, reference is made to the accompanying drawings which form a part hereof, and which is shown, byway of illustration, a preferred embodiment of the present invention. It is understood that other embodiments may be utilized and structural changes may be made without departing from the scope of the present invention.

1. Overview

The present invention first provides simplified, yet near optimal, wire sizing methods for VLSI interconnects. These simplified wire sizing schemes are very efficient, and run in constant time in practice. The delay and area sensitivity study of using different wire widths also suggests a new metric for performance-driven yet area-saving optimization. Then, a general and efficient wire width planning method is provided. It can select just a very small set of pre-determined wire widths per metal layer, rather than using many or even an infinite number of different wire widths as often required by the existing wire sizing methods, and obtain near-optimal results, not just for one interconnect length, but for a wide range of interconnect lengths. Moreover, the wire width planning method of the present invention has a predictable, small amount of error as compared with an optimal solution using many possible wire widths. The wire width planning method can also consider different design objectives, wire length distribution functions, etc..

The main contributions of the present invention include the following:

A limited set of wire widths can be used to optimize the interconnect performance in each layer of the VLSI circuit.

Using only the limited set of wire widths, near-optimal performance can be achieved as compared with layouts using many possible widths.

In particular, two simple wire-sizing schemes, namely single-width sizing (1-WS) and two-width sizing (2-WS) can be used to approximate an optimal wire sizing (OWS).

The tradeoffs between area and delay are described based on a metric of the form $A^iT^j$ where A denotes area and T denotes delay. In particular, the metric $AT^4$ is shown to provide area-efficient performance optimization. This metric typically leads to more than a 60% area reduction, with only about a 10% delay increase compared with a pure delay-driven metric.

One advantage of the present invention is that it provides optimal or near-optimal wire-width planning for better circuit performance, but greatly simplifies interconnect routing architectures, layout tools, and verification tools. Another advantage is that the simplified routing architecture shortens design time and leads to better routing completion rates. Yet another advantage is that the present invention provides better control over the trade-offs between area and delay. A further advantage results from significant increases in execution speed that can be obtained over prior art wire sizing and spacing methods.

2. Interconnect and Device Modeling and Parameters

To illustrate the wire width planning and optimization methodology in this invention, simple but reasonably accurate models for interconnect and device are used herein. A device (driver) is modeled as a switch-level RC circuit [3], and the well-known Elmore delay model [8] is used for delay computation.

The key parameters used by the simplified wire sizing schemes and the wire width planning programs are listed below.

$W_{min}$: minimum wire-width
$S_{min}$: minimum wire spacing
r: sheet resistance
$c_a$: unit area capacitance
$c_f$: unit effective-fringing capacitance as defined in [4]
$t_g$: intrinsic device delay
$c_g$: input capacitance of a minimum device
$r_g$: output resistance of a minimum device
$R_d$: driver effective resistance
l: interconnect length
$C_L$: loading capacitance.

The values of these parameters used to show the effectiveness of this invention are mostly based on the 1997 National Technology Roadmap for Semiconductors (NTRS'97) [12], although the methods in this invention apply to any set of parameters. In addition, the present invention considers the effect of interconnect reverse scaling at higher metal layers. A tier is defined to be a pair of adjacent metal layers with the same cross-sectional dimensions. So, from bottom to top, Tier 1 refers to metal layers 1 and 2, Tier 2 refers to metal layers 3 and 4, . . . and Tier 4 refers to metal layers 7 and 8. Since NTRS'97 only provides the geometry information for Tier 1, for higher metal layers, the geometry information from UC Berkeley's Strawman technology [11] and from SEMATECH [10] is adopted. It shall be noted that the above models and parameters are used only for the illustration of the idea of the invention. Even though they are usually adequate for design planning purpose, more complex and accurate timing analyzers and more complete set of process parameters, when needed, can be used for the wire width planning and optimizations in this invention.

3. Simplified Wire Sizing Schemes and Delay/Area Trade-Off

In this section, simplified wire sizing schemes that use a limited number of wire widths according to the preferred embodiment of the present invention are described. Specifically, two simple yet near optimal wire sizing schemes, namely single-width sizing (1-WS) and two-width sizing (2-WS) are provided to achieve good approximations of optimal wire sizing (OWS) using possibly many wire widths. Further, the delay/area trade-off and their sensitivity to variation of wire widths are explored, and a new metric for area-efficient performance optimization is presented.

3.1 Two Simplified Wire-Sizing Schemes

To simplify the potential routing problem caused by many possible wire-widths of using OWS, two simplified wire-sizing schemes are described, namely optimal single-width sizing (1-WS) and optimal two-width sizing (2-WS). As implied by their names, 1-WS computes the best wire sizing solution with one uniform width, and 2-WS computes the best wire sizing solution with two possible widths, together with the length of each width.

FIGS. 1(a) and (b) illustrate a uniform width interconnect according to the preferred embodiment of the present invention. The interconnect is modeled as an effective resistance $R_d$ connected to an ideal voltage source (not shown). Given an interconnect of length l with loading capacitance $C_L$ and driver resistance $R_d$, as shown in FIG. 1(a), the optimal single-width sizing (1-WS) problem is to determine the best uniform width that minimizers the Elmore delay. To compute the distributed Elmore delay, the original wire is often divided into many small wire segments, and each wire segment is modeled as a π-type RC circuit. For uniform-width interconnect structure, Elmore delay is the same regardless of wire segmentations, thus a simple 1-segment π-type RC circuit is shown in FIG. 1(b). In FIG. 1(b), $R_w$ is the total interconnect resistance, and $C_w$ is the total interconnect capacitance. The delay from the driver to the load, written according to the Elmore delay formula, is:

$$T(w,l)=R_d(c_f l+C_L)+\tfrac{1}{2}rc_a \cdot l^2+R_d \cdot c_a \cdot l \cdot w+(\tfrac{1}{2}r \cdot c_f l^2+rl \cdot C_L) \cdot 1/w \quad (1)$$

The best single-width for minimizing the above delay can be shown to be:

$$w^*(l) = \sqrt{\frac{r(c_f \cdot l + 2C_L)}{2R_d \cdot c_a}} \quad (2)$$

Figure 2:
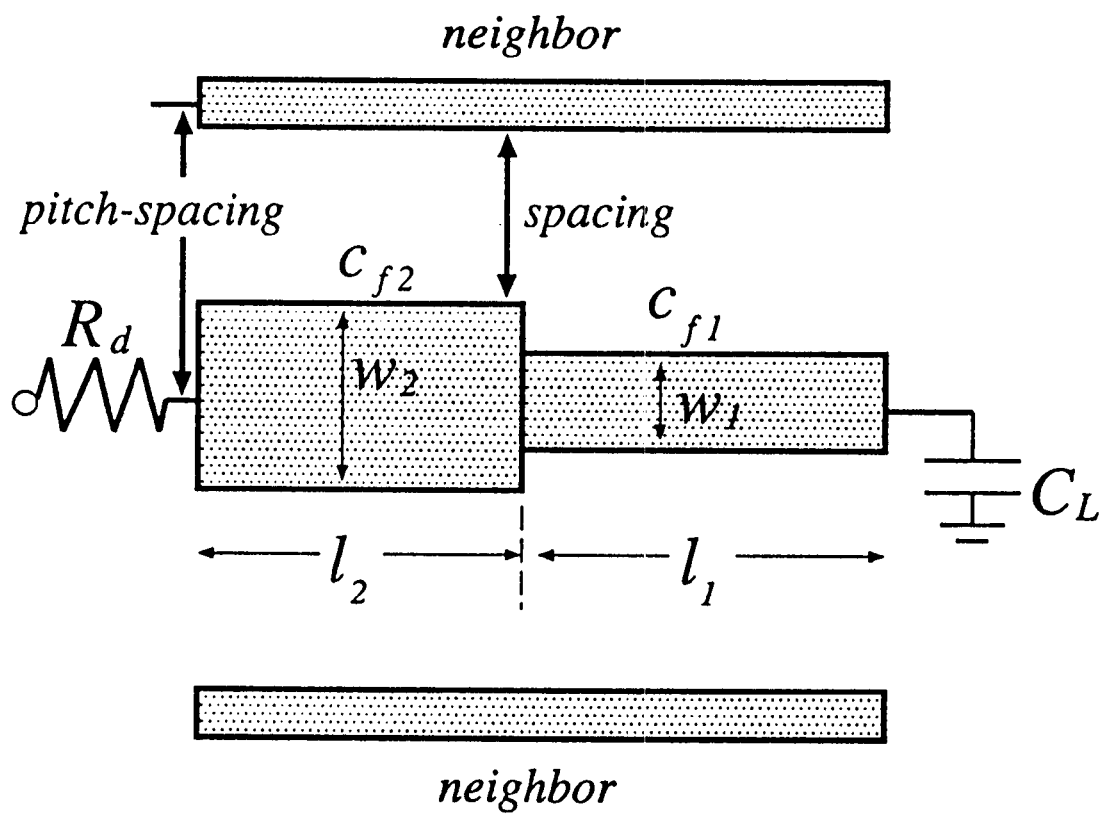
FIG. 2 illustrates two-width sizing according to the preferred embodiment of the present invention.

Another simplified wire sizing optimization scheme proposed baths invention is the optimal two-width sizing (2-WS), as shown in FIG. 2. It will determine the best two wire widths $w_1$ and $w_2$, as well as their lengths $l_1$ and $l_2$ for interconnect optimization. The 2-WS scheme may have different coupling capacitances and thus different effective-fringing capacitances, $c_{f1}$ and $c_{f2}$ for different wire widths (in general, $c_{f1}<c_{f2}$ as $w_1<w_2$). The delay under two-width sizing can be written in a similar manner as in (1).

$$T(w_1, w_2, l_1, l_2) = R_d(l_2 w_2 c_a + l_2 c_{f2} + l_1 w_1 c_a + l_1 c_{f1} + C_L) + \quad (3)$$

$$\frac{1}{2}rc_a \cdot (l_1^2 + l_2^2) + l_1 l_2 rc_a \frac{w_1}{w_2} + r\left(\frac{l_1 l_2 c_{f1}}{w_2} + \frac{l_2^2 c_{f2}}{2w_2} + \frac{l_1^2 c_{f1}}{2w_1}\right) + rC_L \cdot \left(\frac{l_2}{w_2} + \frac{l_1}{w_1}\right)$$

In the above equation, $l_2$ and $l_1$ satisfy the constraint of $l_2+l_1=l$. The delay formula in (3) can be rewritten as a quadratic function of $l_2$:

$$T(w_1, w_2, l_2)=K_2 \cdot l_2^2+K_1 \cdot l_2+K_0 \quad (4)$$

where the coefficients $K_2$, $K_1$ and $K_0$, are:

$$K_2 = rc_a \cdot \left(1 - \frac{w_1}{w_2}\right) + \frac{1}{2}r \cdot \left(\frac{c_{f1}}{w_1} - \frac{c_{f2}}{w_2}\right)$$

$$K_1 = R_d(c_a w_2 + c_{f2} - c_a w_1 - c_{f1}) + rlc_a \cdot \left(\frac{w_1}{w_2} - 1\right) + rl \cdot$$

$$\left(\frac{c_{f2}}{w_2} - \frac{c_{f1}}{w_1}\right) + r \cdot \left(\frac{1}{w_2} - \frac{1}{w_1}\right)$$

$$K_0 = lR_d(c_a w_1 + c_{f1}) + \frac{1}{2}r\left(c_a + \frac{c_{f1}}{w_1}\right)l^2 + \frac{rlC_L}{w_1}$$

Then the optimal length $l_2$ for $w_2$, denoted as $l_2^*$ to minimize the delay $T(w_1, w_2, l_2)$ in equation (4), is either $$-\frac{K_1}{2K_2}$$

(when $K_2>0$ and $$0 < -\frac{K_1}{2K_2} < l),$$

or the better one of 0 and l (otherwise). The resulting optimal delay for given ($w_1$, $w_2$) is:

$$T^*(w_1, w_2) = K_2 \cdot l_2^{*2} + K_1 \cdot l_2^* + K_0 \tag{5}$$

The corresponding interconnect area is:

$$A^*(w_1, w_2) = l_2^* w_2 + (l - l_2^*) w_1 \tag{6}$$

The 2-WS optimization program will search the best wire width pair ($w_1^*$, $w_2^*$) from given design specification. In the search, $w_2^* = \alpha w_1^*$, with $\alpha \in [\alpha_{min}, \alpha_{max}]$. For delay miming solutions, $\alpha$ is usually in a small range (for example, a conservative range for $\alpha$ is $\alpha_{min}=1$ and $\alpha_{max}=5$). To enumerate different $\alpha$'s from $\alpha_{min}$ to $\alpha_{max}$, an incremental step of $\Delta_{min}=0.5$ is usually adequate (with only less than 0.1% delay difference compared to very fine step of $\Delta\alpha=0.01$). The width enumeration for $w_1$ is bounded by the design specification of minimum and maximum widths, and the wire width incremental step for enumeration of $\Delta w = W_{min}/2$ is accurate enough (with less than 0.1% delay difference compared to $\Delta w = W_{min}/100$). Since for a given ($w_1$, $w_2$), the best delay can be computed in closed-form formula in (5), and the number of choices of ($w_1$, $w_2$) is bounded in practice, the computation of the optimal 2-WS solution can be computed in constant time.

Figure 3:
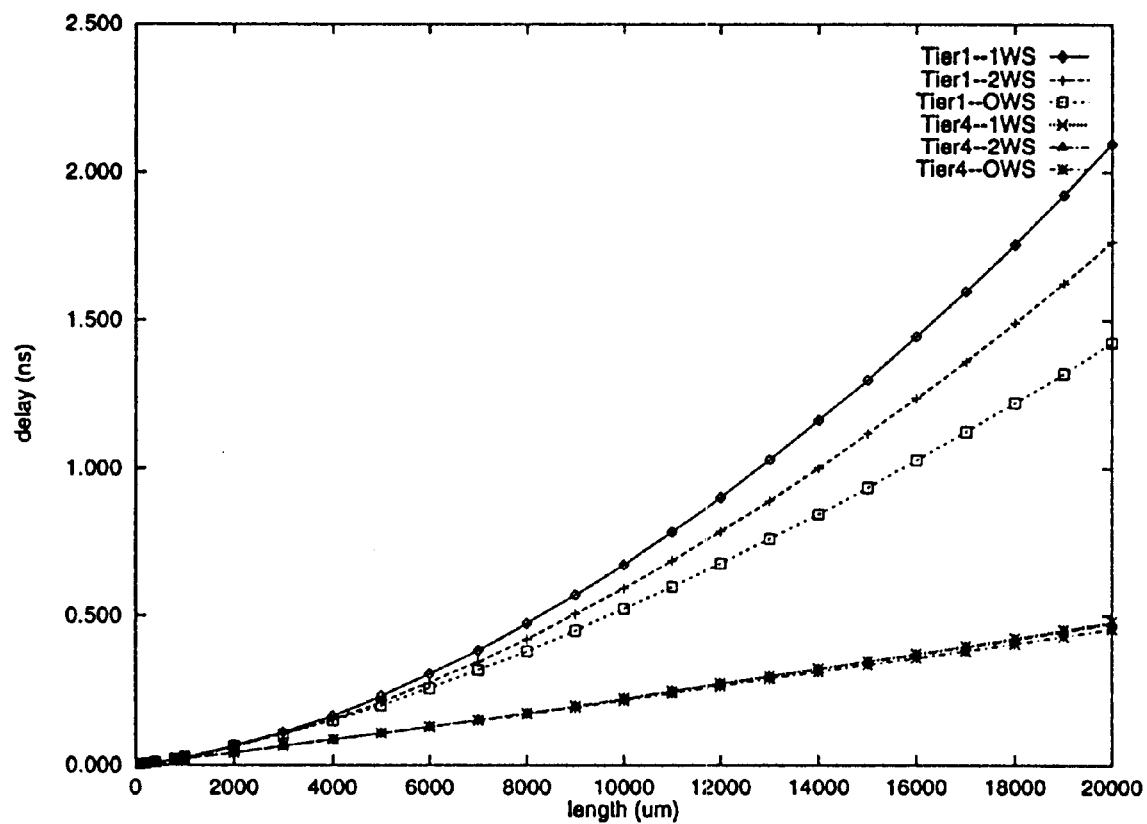
FIG. 3 is a graph that compares single-width sizing (1-WS), two-width sizing (2-WS) and optimal width sizing (OWS) in [5] using 0.10 $\mu$m technology according to the preferred embodiment of the present invention.

Two sets of expedients are conducted to compare 1-WS and 2-WS optimization with those using many different wire widths. The first experiment assumes a constant effective-fringing capacitance $c_f$ as used in the existing wire sizing optimizations [5, 2]. It essentially assumes a fixed nominal spacing to neighboring nets, i.e., when a wire is sized up, its neighboring wires are pushed away. The results show, rather surprisingly, that 1-WS and 2-WS are good approximations to optimal wire sizing (OWS) solutions in [5, 2] that use many or even infinite number of different wire widths, in both delay and area, for a wide range of interconnects and parameters. FIG. 3 shows the delay comparison of 1-WS, 2-WS and OWS for Tier 1 and Tier 4 using the 0.10 μm process technology with $R_d=r_g/100$ and $C_L=c_g\times100$. For Tier 1, 1-WS and 2-WS have at most 10% more delay than OWS for wire length up to 5 mm (for longer wires, buffer insertion will often be used in addition to wire sizing). For Tier 4, 1-WS and 2-WS have almost the same delay as OWS for all wire lengths up to 2 cm.

Figure 4:
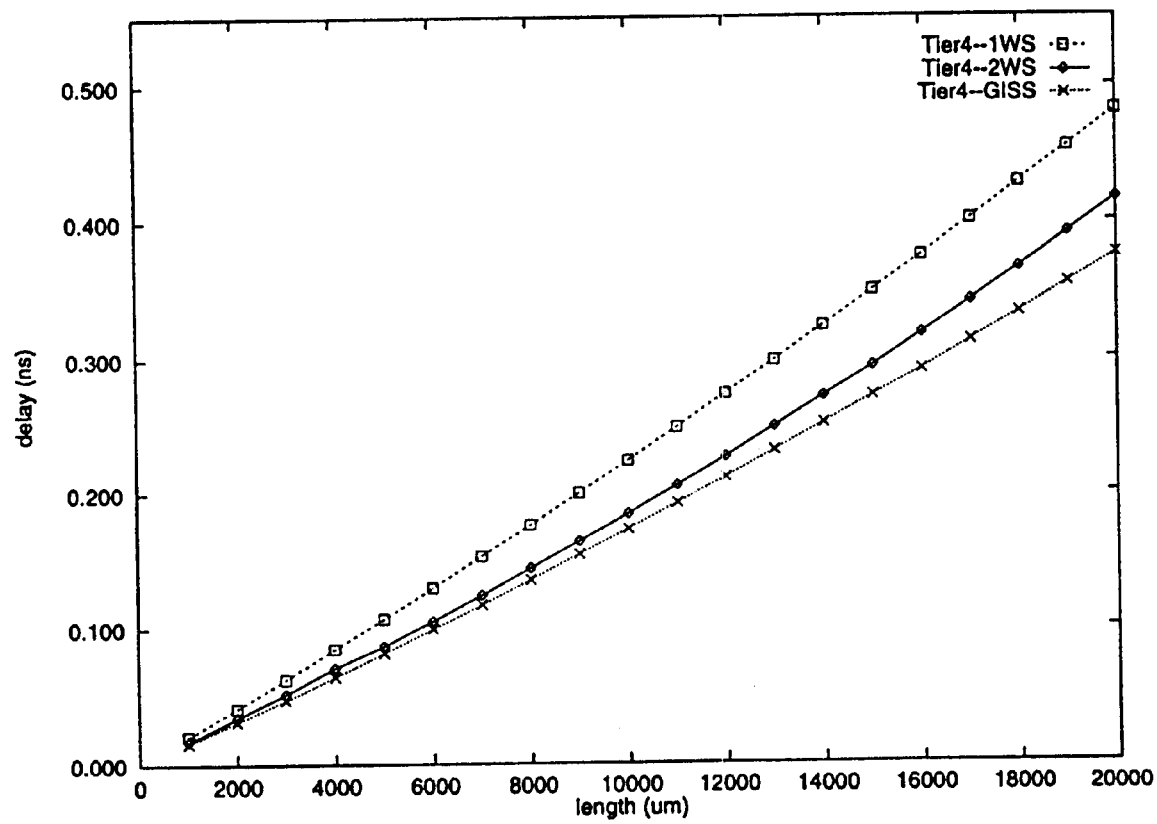
FIG. 4 is a graph that compares single-width sizing (1-WS), two-width sizing (2-WS) and global interconnect sizing and spacing (GISS) in [4] using 0.10 $\mu$m technology according to the preferred embodiment of the present invention.

The second experiment does not assume a constant effective-fringing capacitance; instead, it assumes another common setting with fixed pitch-spacing, defined to be the distance between the center lines of two neighboring wires (see FIG. 2). In this case, when a wire is sized up, its neighboring wires remain at the same location. Thus, the edge-to-edge spacing will be different as wire width changes, resulting in different coupling and effective-fringing capacitances. In this situation, 1-WS solution is not flexible enough to take advantage of down-sizing (wire-tapering) certain downstream wire segments (e.g., those closer to sinks) to reduce the coupling capacitances of the tapered wires to their neighbors. FIG. 4 shows the delay comparison from 1-WS, 2-WS and using many discrete wire widths by running a GISS (Global Interconnect Sizing and Spacing) algorithm [4] that explicitly considers variable coupling capacitances. The Tier 4 of the 0.10 μm technology is used with $R_d=r_g/100$ and $C_L=c_g\times100$. FIG. 4 shows that in this scenario of fixed pitch-spacing, 1-WS has about 15–30% larger delay than 2-WS and GISS, whereas 2-WS has only less than 5% difference compared to GISS with many different widths. In addition to delay, 1-WS usually uses larger area than 2-WS and GISS since it does not have wire tapering, whereas 2-WS has comparable area with GISS (to be shown in Section 4.2).

To briefly summarize, two simplified wire-sizing optimization schemes namely 1-WS and 2-WS are described. It is demonstrated that both 1-WS and 2-WS provide good approximations to OWS [5, 2] with many different wire width, assuming some fixed effective-fringing capacitance (essentially fixed edge-to-edge spacing). Under the fixed pitch-spacing scenario, however, 2-WS is superior to 1-WS, and still provides good approximation to GISS [4] with many different wire widths. In addition, 2-WS will provide more flexibility than 1-WS when a range of wire lengths are to be optimized (to be shown in Section 4).

3.2 Delay/Area Trade-off and Performance-Driven-Area-Efficient Metrics

Pure delay minimization may lead to significant area overhead. Thus, to obtain a good metric for area efficient performance optimization, extensive experiments have been performed on different area-delay metrics, including T (delay only), AT (area-delay product), $AT^2$ (area-delay-square product), $AT^3$, $AT^4$, $AT^5$, etc. The present invention concludes that $AT^4$ is a suitable metric for area-efficient performance optimization, resulting in only a marginal delay increase, but a significant area reduction.

Figure 5:
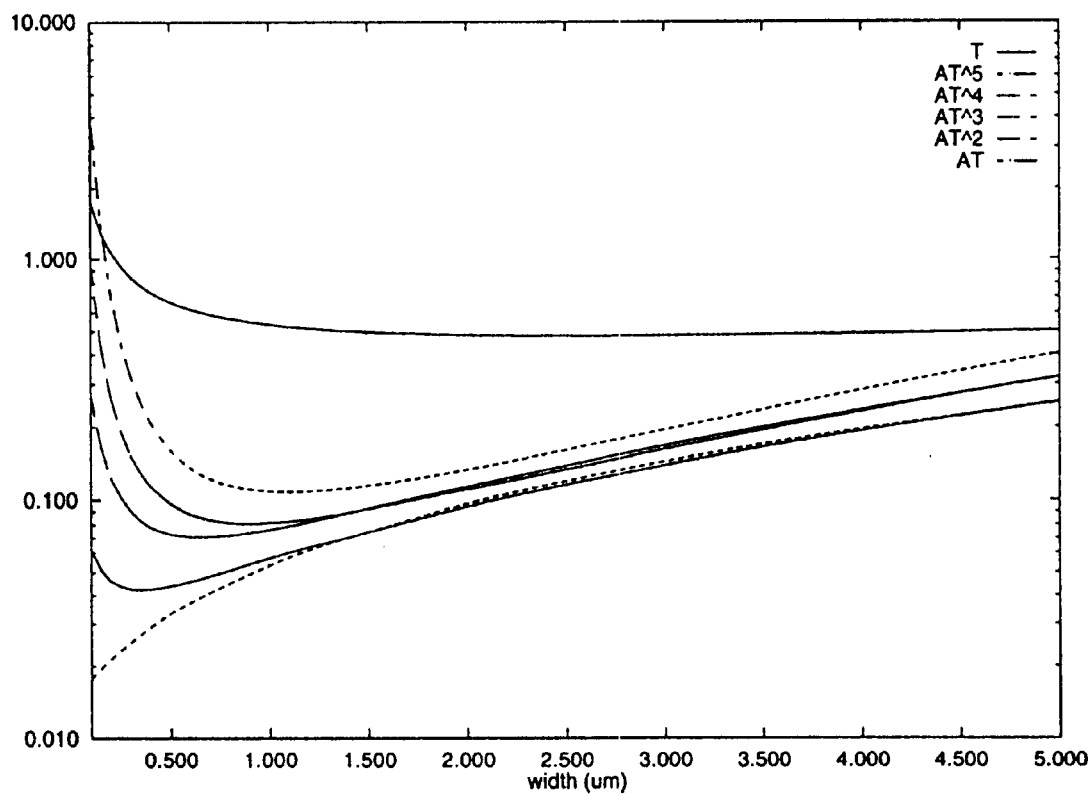
FIG. 5 is a graph that illustrates the different optimization metrics for a 2 cm interconnect in Tier 4 under 0.10 $\mu$m technology according to the preferred embodiment of the present invention.

FIG. 5 shows an example of different optimizations metrics for a 2 cm interconnect in Tier 4 under the 0.10 μm technology, with $R_d=r_g/100$ and $C_L=c_g\times100$. The y-axis is scaled to compare all metrics in one figure. The optimal widths of a 2 cm interconnect for T, $AT^5$, $AT^4$, $AT^3$, $AT^2$, AT are 2.6, 1.15, 1.0, 0.6, 0.3, and 0.1 μm, with delays of 0.48, 0.52, 0.53, 0.62, 0.84, and 1.77 ns, respectively. The optimal width under the $AT^4$ metric uses 62% smaller wiring area than that under the T metric (20,000 μm² vs. 52,000 μm²), but with only a 10% increase of delay. Therefore, the present invention proposes $AT^4$ as a performance-driven yet area-efficient metric for interconnect optimization. It will be used in Section 4 for wire width planning.

4. Wire Width Planning

The delay-area sensitivity study described in the previous section shows that the delay is not sensitive to certain wire-width variations centered around the optimal delay only solution. It suggests that close to optimal performance can be achieved with significant area savings (as shown in Section 3.2). It also suggests that there may exist a small set of "globally" optimal widths for a range of interconnect lengths, and such a small set of predetermined "fixed" widths maybe enough to obtain near-optimal performance for all interconnects in a wide range of wire lengths (not just one length), as opposed to the wire sizing solution with many different widths obtained from running complicated wire sizing/spacing algorithms [5, 4].

This optimal wire-width design greatly simplifies the detailed routing problem and the interaction between higher-level design planning/optimization tools and lower-level routing tools. In particular, if only one or two fixed widths are used for every metal layer, a completely enabled gridless router may not be necessary. This may significantly simplify many problems, including RC extraction, detailed routing and layout verification.

4.1 Overall Approach

The wire-width planning of the present invention is layer based, i.e., it will determine the best width designs for each metal layer. In general, local interconnects are routed in the lower metal layers, while global interconnects are routed in the higher metal layers for achieving best performance, density and area optimization.

Given wire length range and distribution for all interconnects at any specified metal layer, the wire-width planning method of the present invention finds the best width vector $\vec{W}$ for this metal layer, such that the following objective function:

$$\Phi(\vec{W}, l_{min}, l_{max}) = \int_{l_{min}}^{l_{max}} \lambda(l) \cdot f(\vec{W}, l) \, dl \quad (7)$$

is minimized, where $l_{min}$ and $l_{max}$ are the minimum and maximum interconnect lengths that are assigned to the metal layer, $\lambda(l)$ is the weighting function for length $l$, and $f(\vec{W}, l)$ is the objective function to be minimized by the design. To illustrate the idea of the methodology in this invention, the design metric of $f(\vec{W}, l) = A^j(\vec{W}, l) \cdot T^k(\vec{W}, l)$ is used, where $A(\vec{W}, l)$ and $T(\vec{W}, l)$ denote the area and delay for interconnect of length $l$ using wire width set of $\vec{W}$. For 1-width design, $\vec{W}$ has only one component W. For 2-width design, $\vec{W}$ has two components $W_1$ and $W_2$. In general, the wire width planning in this invention uses only a very limited number of wire widths (such as one or two-widths, etc.). As to be shown in Section 4.2, the 2-width design is usually adequate to achieve close to optimal performance, thus is recommended for most designs. Yet, if needed, one can compute a small number of more wire widths using the same method described in this invention.

For the case of j=0 and k=1 in the design optimization metric, the objective is the performance optimization only. However, as shown in Section 3, this tends to use large wire-widths with marginal performance gain, since the delay/width curve becomes very flat while approaching optimal delay. The performance-driven, yet area-efficient metric $AT^4$ (i.e., j=1 and k=4) obtained in Section 4.2 can be used for area-efficient performance optimization.

Analytical or numerical methods can be used to compute the best 1-width or 2-width (or a small number of more widths) design to minimize the objective function in equation (7). The 1-width planning with metric $f(\vec{W}, l) = T(\vec{W}, l)$ and uniform weighting function $\lambda(l) = 1$ are used as an example to illustrate how the wire-width planning works.

For 1-width planning, the present invention needs to determine the "globally" optimal width to minimize:

$$\int_{l_{min}}^{l_{max}} T(w, l) \, dl$$

where:

$$T(w, l) = R_d c_f l + R_d C_L + \frac{1}{2} r c_a \cdot l^2 +$$
$$R_d c_a l w + \left(\frac{1}{2} r c_f \cdot l^2 + r l C_L\right) \cdot \frac{1}{w}$$

is the delay for wire length $l$ with width w, the same as equation (1). Then the "globally" optimal width $W^*$ for all wire lengths from $l_{min}$ to $l_{max}$ is described by the following simple closed-form formula:

$$W^* = \sqrt{\frac{\int_{l_{min}}^{l_{max}} r\left(\frac{1}{2} r c_f l + r C_L\right) l \, dl}{\int_{l_{min}}^{l_{max}} R_d c_a l \, dl}} \quad (8)$$

$$= \sqrt{\frac{\frac{1}{3} r c_f (l_{max}^3 - l_{min}^3) + r C_L (l_{max}^2 - l_{min}^2)}{R_d c_a (l_{max}^2 - l_{min}^2)}}$$

For the 1-width design under metric $AT^4$, a simple analytical formula like equation (8) may not be obtained as an 8the order equation that must be solved for variable w, which does not have analytical solutions. In this case, numerical method will be used to find the "globally" optimal width $W^*$ by enumerating all available discrete wire width choices (provided by a given technology or design specification).

Similarly, for the 2-width design, the present invention can obtain the "globally" optimal width pair for $(W_1, W_2)$, denoted as $(W_1^*, W_2^*)$, for all wire lengths from $l_{min}$ to $l_{max}$ by efficient enumeration, in a similar manner as in computing the optimal 2-WS for a fixed wire length l in Section 3.1. Without loss of generality, $W_2^* = \alpha W_1^*$, with $\alpha \in [\alpha_{min}, \alpha_{max}]$. As in the 2-WS, $\alpha_{min} = 1$, $\alpha_{max} = 5$ and $\Delta\alpha = 0.5$ are usually sufficient for enumeration. The $W_1$ range can be obtained from minimum width $W_{min}$ and maximum width $W_{max}$. Again, the wire width incremental step for enumeration of $W_{min}/2$ is accurate enough (with less than 0.1% delay difference compared to very fine increment of $W_{min}/100$). Note that for a given $(W_1, W_2)$, the best delay $T^*(W_1, W_2)$ for any wire length l in the range of $[l_{min}, l_{max}]$ can be computed in closed-form formula in equation (5). It shall be pointed out that the time complexity of the wire width planning is not a major concern, since it only needs to be run once for a given design or a set of designs with similar characteristics. The key idea, however, is to identify a small number of globally optimal wire widths, such that using these pre-determined wire widths, the near optimality can be met, rather than using a large number of wire widths.

The inclusion of weighting function $\lambda(l)$ in the wire width planning objective function (7) provides a lot of flexibilities. It can be the wire length distribution function of the design, or it can be a weight that the designer wants to assign on different wire lengths (e.g., larger weights for global interconnects). The wire length distribution function maybe obtained on a specific design after its logic blocks are roughly determined and placed, or it maybe obtained from some stochastic wire length distribution method like the one in [6] on a set of designs. The wire-width design obtained in this invention, nonetheless, is robust and has a small maximum error to any weighting function (to be demonstrated in Section 4.3), as justified by the following theorem Let $f(\vec{W}, l)$ denote the optimization metric using an arbitrary (infinite) number of wire widths, and $f(\vec{W}^*, l)$ denote the optimization metric using only the small set of wire widths from the wire width planning method in this invention, it can be proven that: (Maximum Error Theorem) if $$\left| \frac{f(\vec{W}, l) - f(\vec{W}^*, l)}{f(\vec{W}^*, l)} \right| \leq \delta_{max} \text{ for any } l \in (l_{min}, l_{max})$$

then for any weighting function $\lambda(l)$:

$$\left| \frac{\Phi(\vec{W}, l_{min}, l_{max}) - \Phi(\vec{W}^*, l_{min}, l_{max})}{\Phi(W^*, l_{min}, l_{max})} \right| \leq \delta_{max} \quad (9)$$

where $\Phi(\vec{W}, l_{min}, l_{max})$ is the optimization metric for the entire wire length range.

4.2 Effectiveness of Wire-Width Planning

In this subsection, the results from using 1-width and 2-width designs under the $AT^4$ metric are presented to demonstrate the effectiveness of wire width planning methodology in this invention. These results suggest that the 2-width design under the $AT^4$ metric has both area efficiency and also near optimal performance.

The following wire length distribution for each metal layer is assumed for the experiments. In general, local interconnects are routed in the lower tier, while global interconnects are routed in the higher tier. The maximum wire length ($l_{max}$) in Tier 1 is assumed to be 10,000×feature size, and $l_{max}$ in the top tier is $L_{edge}$, i.e., the chip dimension under a given technology [12, 10]. The $l_{max}$ in the intermediate tiers will be determined by a geometric sequence such that for any tier i, $l_{max}(i+1)/l_{max}(i)=l_{max}(i)/l_{max}(i-1)$.

Table 1 shows the maximum wire length $l_{max}$ (in mm) assigned to each tier for NTRS'97 technologies [12]. The minimum wire length for tier i is the maximum length for tier i−1, i.e., $l_{min}(i)=l_{max}(i-1)$. A representative driver is used for each metal tier for the wire-width planning. The drivers for Tier 1 through Tier 4 are 10×, 40×, 100×, and 250× of the minimum gate in the given technology, respectively.

TABLE 1

| Tech (μm) | 0.25 | 0.18 | 0.13 | 0.10 | 0.07 |
|---|---|---|---|---|---|
| Tier 1 | 2.50 | 1.80 | 1.30 | 1.00 | 0.70 |
| Tier 2 | 6.50 | 5.85 | 3.27 | 2.84 | 2.30 |

TABLE 1-continued

| Tech (μm) | 0.25 | 0.18 | 0.13 | 0.10 | 0.07 |
|---|---|---|---|---|---|
| Tier 3 | 17.3 | 19.0 | 8.23 | 8.04 | 7.57 |
| Tier 4 | — | — | 20.7 | 22.8 | 24.9 |

Table 2 shows the comparison of using the optimal 1-width and 2-width designs by the wire width planning method in this invention versus using many discrete wire widths (simply denoted as wire-width in Table 2) by running a GISS (Global Interconnect Sizing and Spacing) algorithm [4], wherein Tier 4 of the 0.10 μm technology is used with wire lengths ranging from 8.04 to 22.8 mm, and the driver size is 250×min. Three different pitch-spacings (pitch-sp) between adjacent wires in Tier 4 of the 0.10 μm technology are used. For each pitch-sp, the average delay, the maximum delay difference (in percentage) from the many-width solution ($\Delta T_{max}$) for all lengths, and the average width are compared. For a pitch-spacing of 2.0 μm, the 1-width design has an average delay about 14% and 20% larger than those from the 2-width design and the m-width solution. Moreover, it has an average wire-width (thus area) of about 1.83× and 1.92× of those from the 2-width design and the many-width solution. Thus, although 1-WS works well for a fixed wire length with fixed effective-fringing capacitance (see comparison with OWS in Section 3.1), the 1-width design is not flexible enough for a wide range of interconnect lengths and for fixed pitch-spacing situation. The 2-width design, however, has near optimal delay as compared to the m-width solution obtained from running the GISS algorithm (just 3–5% larger) and uses just a slightly bigger area (less than 5%) than that of the many-width design. When the pitch-spacing becomes larger, the difference between the 1-width design, the 2-width design and the many-width design will get smaller.

In Table 2, the maxima delay difference ($\Delta T_{max}$) between 1-width and 2-width designs versus many-width solution [4] is also listed. It is an important metric which can bound the estimation error under any weighting function $\lambda(l)$ in equation (7) based on the Maximum Error Theorem listed in Section 4.1. Since using the 2-width design derived from a uniform weighting function $\lambda(l)\equiv1$, the maximum delay difference $\Delta T_{max}$ is only 3.9–7%, according to the Theorem, this 2-width design will differ from the optimal-width design (using possibly many widths) by at most 3.9–7% for any weighting function $\lambda(l)$.

TABLE 2

| Scheme | pitch-sp = 2.0 μm | | | pitch-sp = 2.9 μm | | | pitch-sp = 3.8 μm | | |
|---|---|---|---|---|---|---|---|---|---|
| | $T_{avg}$ | $\Delta T_{max}$ | avg-w | $T_{avg}$ | $\Delta T_{max}$ | avg-w | $T_{avg}$ | $\Delta T_{max}$ | avg-w |
| 1-width | 0.245 | 28.2% | 1.98 | 0.177 | 15.7% | 1.83 | 0.143 | 5.9% | 1.63 |
| 2-width | 0.215 | 7.0% | 1.08 | 0.167 | 5.9 | 1.23 | 0.140 | 3.9% | 1.41 |
| m-width[4] | 0.204 | — | 1.03 | 0.159 | — | 1.19 | 0.136 | — | 1.38 |

4.3 Example Wire Width Planning Results For Technology Generations Outlined in NTRS'97

A sample wire-width ping for future technology generations listed in NTRS'97 from 0.25 to 0.07 μm has also been performed. The recommendation is based on the optimal 2-width design under the area-efficient performance optimization metric $AT^4$. The results are shown in Table 3. It suggests that the minimum widths be used for local interconnects in Tier 1. For Tier 2 to Tier 4, it suggests two different pre-determined wire-widths with a 1:2 ratio be used. Therefore, there is a wiring hierarchy on different metal layers such that Tier 2 is about 1–2 times wider than Tier 1, Tier 3 is about 2–3 times wider than Tier 2, and Tier 4 (if available) is about 4–5 times wider than Tier 3. Such a simple, pre-determined wiring hierarchy can effectively achieve close to optimal RC delays for all local, semi-global and global interconnects while ensuring high routing density and much simplified routing solutions.

TABLE 3

| Tech   |          | (μm) 0.25 | 0.18 | 0.13 | 0.10 | 0.07 |
|--------|----------|-----------|------|------|------|------|
| Tier 1 | $W_1^*$  | 0.25      | 0.18 | 0.13 | 0.10 | 0.07 |
|        | $W_2^*$  | 0.25      | 0.18 | 0.13 | 0.10 | 0.07 |
| Tier 2 | $W_1^*$  | 0.25      | 0.18 | 0.13 | 0.10 | 0.08 |
|        | $W_2^*$  | 0.50      | 0.26 | 0.26 | 0.20 | 0.16 |
| Tier 3 | $W_1^*$  | 0.65      | 0.47 | 0.24 | 0.22 | 0.23 |
|        | $W_2^*$  | 1.30      | 0.94 | 0.48 | 0.44 | 0.46 |
| Tier 4 | $W_1^*$  | —         | —    | 0.98 | 1.00 | 1.06 |
|        | $W_2^*$  | —         | —    | 1.96 | 2.00 | 2.12 |

5. Summary

In summary, the present invention provides two simplified wire sizing schemes (1-WS and 2-WS) and an area-efficient performance optimization metric $AT^4$ for interconnect optimization. Based on these simple but accurate schemes and metric, wire width planning can be performed. The present invention shows that using the a small set of pre-determined globally optimal wire widths (usually just two-widths) for each metal layer, near-optimal performance can be achieved as compared to using many or even infinite number of wire widths derived from complex wire sizing/spacing algorithms.

The present invention can be used in many applications, such as RTL planning, interconnect-driven synthesis, floor-planning and placement. The simplified wire sizing schemes can easily be combined with other interconnect optimization techniques, such as driver sizing, buffer insertion/sizing, and so on. Moreover, these wire-width planning results provide a number of benefits, including: (a) better circuit performance due to automatic optimal wire width planning; (b) better control of performance and area trade-offs given the flexibility of the method in handling various optimization objectives; (c) better routing completion rate due to simplification of routing architecture; and (d) better design convergence and shorter design time due to top-down planning and simplification of routing architecture.

6. Wire Width Planning and Optimization Implementation

Figure 6:
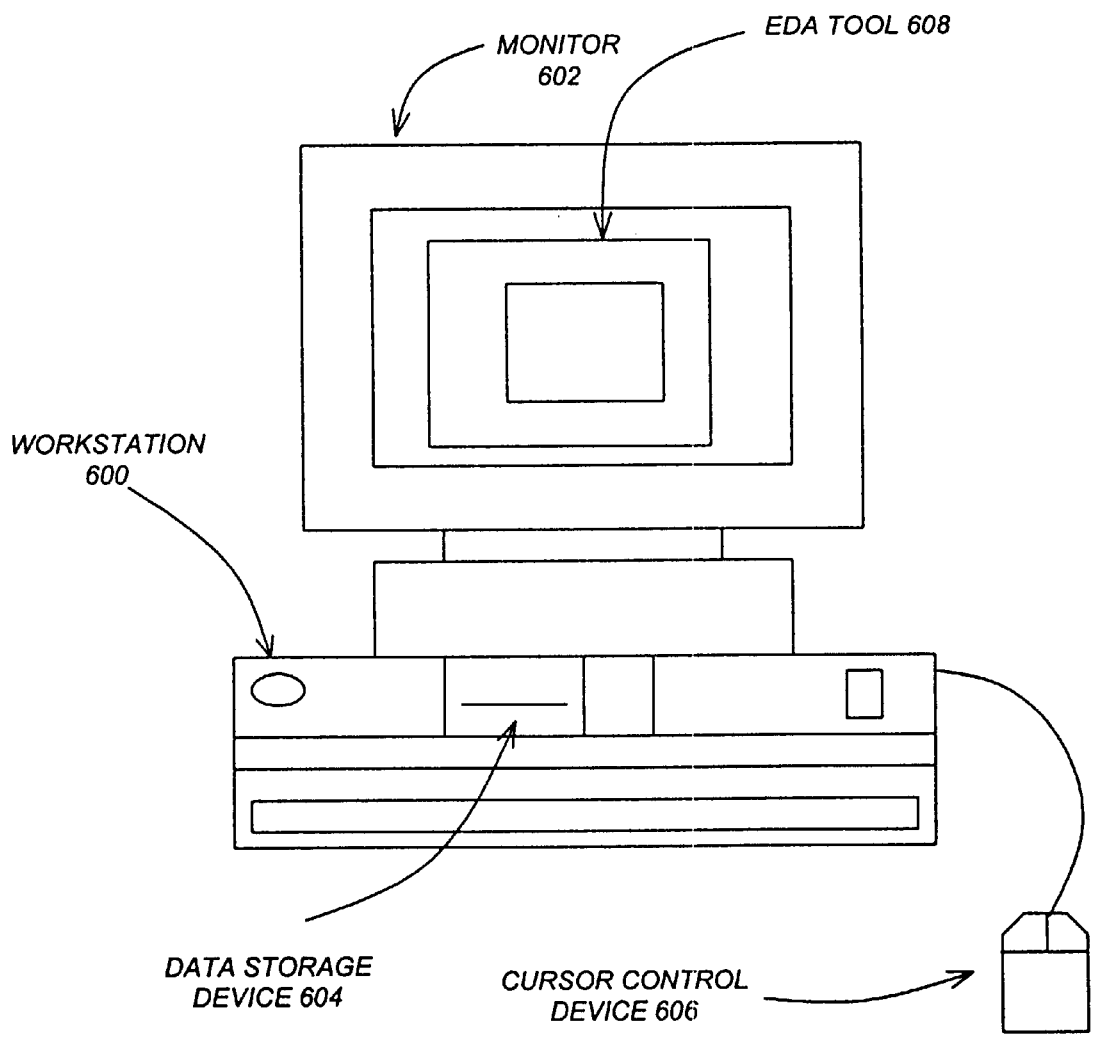
FIG. 6 is an exemplary hardware environment used to implement the preferred embodiment of the invention.

FIG. 6 is an exemplary hardware and software environment used to implement the preferred embodiment of the invention. The preferred embodiment of the present invention is typically implemented using a workstation 600, which generally includes, inter alia, a monitor 602, data storage devices 604, cursor control devices 606, and other devices. Those skilled in the art will recognize that any combination of the above components, or any number of different components, peripherals, and other devices, may be used with the workstation 600.

The preferred embodiment of the present invention is implemented by an electronic design automation (EDA) tool 608 executed by the workstation 600, wherein the EDA tool 608 is represented by a window displayed on the monitor 602. Generally, the EDA tool 608 comprises logic and/or data embodied in or readable from a device, media, carrier, or signal, e.g., one or more fixed and/or removable data storage devices 604 connected directly or indirectly to the workstation 600, one or more remote devices (such as servers) coupled to the workstation 600 via data communications devices, etc.

Those skilled in the art will recognize that the exemplary environment illustrated in FIG. 6 is not intended to limit the present invention. Indeed, those skilled in the art will recognize that other alternative environments may be used without departing from the scope of the present invention.

Figure 7:
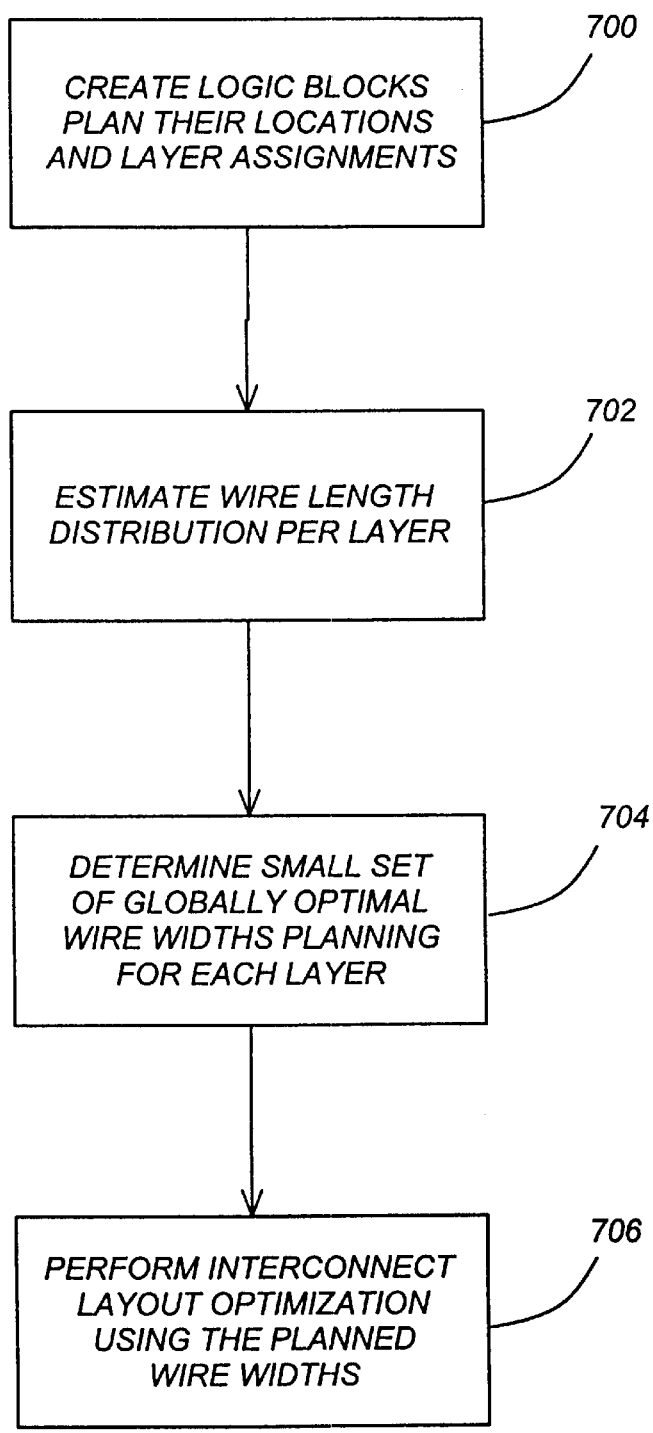
FIG. 7 is a flowchart that illustrates a method for wire width planning and optimization for very large scale integration (VLSI) interconnect performance optimization according to the preferred embodiment of the present invention.

FIG. 7 is a flowchart that illustrates the design and optimization flow performed by the EDA tool 608 according to the preferred embodiment of the present invention. Specifically, FIG. 7 discloses a method for wire width planning and optimization for very large scale integration (VLSI) interconnect performance optimization according to the preferred embodiment of the present invention.

In step 700, the logic blocks are first generated, and their locations are planned, either at the RT (register-transistor) level or at the gate level.

Then in step 702, the wire length information for all interconnects in the design is estimated based on the logic block locations. By assigning each interconnect to a specific metal layer, the wire length distribution of each layer is obtained. Alternatively, the wire length distribution data may also be extracted from previous designs of similar characteristics, so that the present invention can be applied even before any floorplan and/or layer assignment is performed. Or the wire length distribution function may be obtained using some statistical models such as in [6].

In step 704, a small set of globally optimal wire widths for one or more specified layers are determined using the method of the present invention. Usually two-width design is good enough.

In step 706, the layout of the interconnects on a specified layer is generated and optimized using the small set of wire width design obtained from step 704.

7. References

The following references are all incorporated by reference herein:

[1] C.-P. Chen, Y. P. Chen, and D. F. Wong, Optimal wire-sizing formula under the Elmore delay model, in Proc. Design Automation Conf., pp. 487–490, 1996.

[2] C.-P. Chen and D. F. Wong, Optimal wire sizing function with fringing capacitance consideration, in Proc. Design Automation Conf, pp. 604–607, 1997.

[3] J. Cong, L. He, K. Y. Khoo, C. K. Koh, and Z. Pan, "Interconnect design for deep submicron ICs," in Proc. Int. Conf. on Computer Aided Design, pp. 478–485, 1997.

[4] J. Cong, L. He, C. K. Koh, and Z. Pan, "$^4$Global interconnect sizing and spacing with consideration of coupling capacitance," in Proc. Int. Conf. on Computer Aided Design, pp. 628–633, 1997.

[5] J. Cong and K. S. Leung, "Optimal wiresizing under the distributed Elmore delay model," in Proc. Int. Conf. on Computer Aided Design, pp. 634–639, 1993.

[6] J. Davis, V. De, and J. Meindl, "A stochastic wire-length distribution for gigascale integration (GSI) i. derivation and validation," IEEE Transactions on Electron Devices, vol. 45, no. 3, pp.580–9, 1998.

[7] J. Davis and J. Meindl, "Is interconnect the weak link!," IEEE Circuits and Devices Magazine, vol. 14, no. 2, pp. 30–36, 1998.

[8] W. C. Elmore, "The transient response of damped linear networks with particular regard to wide-band amplifiers," Journal of Applied Physics, vol. 19, pp. 55–63, Jan. 1948.

[9] J. P. Fishburn and C. A. Schevon, Minimal delay conductive lead lines for integrated circuits. U.S. Pat. No. 5,841,333

[10] P. Fisher and R. Nesbitt, "The test of time. clock-cycle estimation and test challenges for future microprocessors," IEEE Circuits and Devices Magazine, vol. 14, pp. 37–44, March 1998

[11] R. Otten and R. K. Brayton, "Planning for performance," in Proc. Design Automation Conf, pp. 122–127, June 1998.

[12] Semiconductor Industry Association, National Technology Roadmap for Semiconductors, 1997.

CONCLUSION

This concludes the description of the preferred embodiment of the invention. The following describes some alternative embodiments for accomplishing the present invention.

Any type of computer could be used to implement the present invention. For example, computer systems such as a mainframe, minicomputer, or personal computer, could be used to implement the present invention.

In addition, any program, logic, or function providing wire-width planning could be used to implement the present invention. For example, a number of different EDA tools could be used to implement the present invention.

In summary, the present invention discloses a method, apparatus, and article of manufacture for wire width planning and performance optimization for very large scale integration (VLSI) interconnects. Two simplified wire sizing schemes are described for an interconnect, namely a single-width sizing (1-WS) or a two-width sizing (2-WS). These simplified wire sizing schemes have near optimal performance as compared to complex optimal wire sizing with many or even an infinite number of wire widths. A wire width planning method is then described to determine a small set of globally optimal wire widths for VLSI interconnects in a range of lengths. It is concluded that near optimal interconnect performance can be achieved using such a pre-designed, limited number of wire widths (usually two-width design is adequate), compared to that by using many or even infinite ha number of different wire widths. The layout for the VLSI interconnects is then generated and optimized using the limited number of planned wire widths.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for wire width planning and performance optimization for a very large scale integration (VLSI) interconnect, comprising:

(a) determining a small number of globally optimal wire widths for the VLSI interconnect in a range of interconnect lengths; and (b) generating an optimized layout for the VLSI interconnect using the small number of globally optimal wire widths.

2. The method of claim 1, wherein the determining and generating steps are guided by a metric including both area and delay for the VLSI interconnect.

3. The method of claim 1, wherein the determining and generating steps further comprise two wire sizing optimization schemes for the VLSI interconnect, including single-width sizing (1-WS) and two-width sizing (2-WS).

4. The method of claim 3, wherein the single-width sizing (1-WS) computes an optimal wire sizing (OWS) with a uniform wire width for the VLSI interconnect.

5. The method of claim 3, wherein the two-width sizing (2-WS) computes an optimal wire sizing (OWS) with two optimal wire widths together with a length for each of the two optimal wire widths for the VLSI interconnect.

6. The method of claim 3, wherein the single-width sizing (1-WS) and the two-width sizing (2-WS) approximate an optimal wire sizing (OWS) with a plurality of wire widths in both delay and area, and achieve close to optimal performance under a fixed effective-fringing capacitance coefficient for the VLSI interconnect.

7. The method of claim 3, wherein the two-width sizing (2-WS) approximates an optimal global interconnect sizing and spacing (GISS) with a plurality of wire widths in both delay and area, and achieves close to optimal performance under a fixed pitch-spacing for the VLSI interconnect.

8. The method of claim 1, wherein the determining step further comprises planning the small number of globally optimal wire widths for the range of interconnect lengths.

9. The method of claim 8, wherein planning step further comprises finding at least one-width vector $\vec{W}$ with the small number of globally optimal wire widths for the range of interconnect lengths $l_{min}$ to $l_{max}$ such that an objective function:

$$\Phi(\vec{W}, l_{min}, l_{max}) = \int_{l_{min}}^{l_{max}} \lambda(l) \cdot f(\vec{W}, l) dl$$

is minimized, wherein $\lambda(l)$ is a weighting function for l, and $f(\vec{W}, l)$ is the objective function for an interconnect length l using $\vec{W}$.

10. The method of claim 9, wherein $f(\vec{W}, l) = A^j(\vec{W}, l) T^k(\vec{W}, l)$ with $A(\vec{W}, l)$ being an area using $\vec{W}$ and $T(\vec{W}, l)$ being a delay using $\vec{W}$ that provides an area-delay tradeoff in the objective function.

11. The method of claim 10, wherein j=1 and k=4 for an area-efficient performance optimization.

12. The method of claim 9, wherein $\vec{W}$ has one component W for one-width planning for the range of interconnect lengths.

13. The method of claim 9, wherein $\vec{W}$ has two components $W_1$ and $W_2$ for two-width planning for the range of interconnect lengths.

14. The method of claim 9, further comprising finding a best one-width planning, two-width planning, or wire-width planning with a small number of wire widths to minimize the objective function.

15. The method of claim 14, wherein the two-width planning achieves close to optimal performance in both delay and area for the range of interconnect lengths.

16. The method of claim 9, further comprising determining a maximum error $\delta_{max}$ using a weighting function $\lambda(l)$, wherein if $$\left| \frac{f(\vec{W}, l) - f(\vec{W}^*, l)}{f(\vec{W}^*, l)} \right| \leq \delta_{max} \text{ for any } l \in (l_{min}, l_{max})$$

then for the weighting function $\lambda(l)$:

$$\left| \frac{\Phi(\vec{W}, l_{min}, l_{max}) - \Phi(\vec{W}^*, l_{min}, l_{max})}{\Phi(W^*, l_{min}, l_{max})} \right| \leq \delta_{max}$$

and $\Phi(\vec{W}, l_{min}, l_{max})$ is an optimization metric for the interconnect lengths $l_{min}$ to $l_{max}$.

17. The method of claim 8, further comprising planning the small number of globally optimal wire widths for the range of interconnect lengths per metal layer of the VLSI interconnect to achieve near-optimal performance.

18. An apparatus for wire width planning and performance optimization for a very large scale integrated (VLSI) interconnect, comprising:
   (a) a computer;
   (b) means, performed by the computer, for:
       (1) determining a small number of globally optimal wire widths for the VLSI interconnect in a range of interconnect lengths; and
       (2) generating an optimized layout for the VLSI interconnect using the small number of globally optimal wire widths.

19. The apparatus of claim 18, wherein the means for determining and generating are guided by a metric including both area and delay for the VISI interconnect.

20. The apparatus of claim 18, wherein the means for determining and generating further comprise two wire sizing optimization schemes for the VLSI interconnect, including single-width sizing (1-WS) and two-width sizing (2-WS).

21. The apparatus of claim 20, wherein the single-width sizing (1-WS) computes an optimal wire sizing (OWS) with a uniform wire width for the VLSI interconnect.

22. The apparatus of claim 20, wherein the two-width sizing (2-WS) computes an optimal wire sizing (OWS) with two optimal wire widths together with a length for each of the two optimal wire widths for the VLSI interconnect.

23. The apparatus of claim 20, wherein the single-width sizing (1-WS) and the two-width sizing (2-WS) approximate an optimal wire sizing (OWS) with a plurality of wire widths in both delay and area, and achieve close to optimal performance under a fixed effective-fringing capacitance coefficient for the VLSI interconnect.

24. The apparatus of claim 20, wherein the two-width sizing (2-WS) approximates an optimal global interconnect sizing and spacing (GISS) with a plurality of wire widths in both delay and area, and achieves close to optimal performance under a fixed pitch-spacing for the VLSI interconnect.

25. The apparatus of claim 18, wherein the means for determining further comprises means for planning the small number of globally optimal wire widths for the range of interconnect lengths.

26. The apparatus of claim 25, wherein the means for planning further comprises means for finding at least one-width vector $\vec{W}$ with the small number of globally optimal wire widths for the range of interconnect lengths $l_{min}$ to $l_{max}$ such that an objective function:

$$\Phi(\vec{W}, l_{min}, l_{max}) = \int_{l_{min}}^{l_{max}} \lambda(l) \cdot f(\vec{W}, l) dl$$

is minimized, wherein $\lambda(l)$ is a weighting function for l, and $f(\vec{W}, l)$ is the objective function for an interconnect length l using $\vec{W}$.

27. The apparatus of claim 26, wherein $f(\vec{W}, l) = A^j(\vec{W}, l) T^k(\vec{W}, l)$ with $A(\vec{W}, l)$ being an area using $\vec{W}$ and $T(\vec{W}, l)$ being a delay using $\vec{W}$ that provides an area-delay tradeoff in the objective function.

28. The apparatus of claim 27, wherein j=1 and k=4 for an area-efficient performance optimization.

29. The apparatus of claim 26, wherein $\vec{W}$ has one component W for one-width planning for the range of interconnect lengths.

30. The apparatus of claim 26, wherein $\vec{W}$ has two components $W_1$ and $W_2$ for two-width planning for the range of interconnect lengths.

31. The apparatus of claim 26, further comprising means for finding a best one-width planning, two-width planning, or wire-width planning with a small number of wire widths to minimize the objective function.

32. The apparatus of claim 31, wherein the two-width planning achieves close to optimal performance in both delay and area for the range of interconnect lengths.

33. The apparatus of claim 26, further comprising means for determining a maximum error $\delta_{max}$ using a weighting function $\lambda(l)$, wherein if $$\left| \frac{f(\vec{W}, l) - f(\vec{W}^*, l)}{f(\vec{W}^*, l)} \right| \leq \delta_{max} \text{ for any } l \in (l_{min}, l_{max})$$

then for the weighting function $\lambda(l)$:

$$\left| \frac{\Phi(\vec{W}, l_{min}, l_{max}) - \Phi(\vec{W}^*, l_{min}, l_{max})}{\Phi(W^*, l_{min}, l_{max})} \right| \leq \delta_{max}$$

and $\Phi(\vec{W}, l_{min}, l_{max})$ is an optimization metric for the interconnect lengths $l_{min}$ to $l_{max}$.

34. The apparatus of claim 25, further comprising means for planning the small number of globally optimal wire widths for the range of interconnect lengths per metal layer of the VLSI interconnect to achieve near-optimal performance.

35. An article of manufacture embodying logic for performing a method for wire width planning and performance optimization for a very large scale integrated (VLSI) interconnect, the method comprising:
   (a) determining a small number of globally optimal wire widths for the VLSI interconnect in a range of interconnect lengths; and
   (b) generating an optimized layout for the VLSI interconnect using the small number of globally optimal wire widths.

36. The method of claim 35, wherein the determining and generating steps are guided by a metric including both area and delay for the VLSI interconnect.

37. The method of claim 35, wherein the determining and generating steps further comprise two wire sizing optimization schemes for the VLSI interconnect, including single-width sizing (1-WS) and two-width sizing (2-WS).

38. The method of claim 37, wherein the single-width sizing (1-WS) computes an optimal wire sizing (OWS) with a uniform wire width for the VLSI interconnect.

39. The method of claim 37, wherein the two-width sizing (2-WS) computes an optimal wire sizing (OWS) with two optimal wire widths together with a length for each of the two optimal wire widths for the VLSI interconnect.

40. The method of claim 37, wherein the single-width sizing (1-WS) and the two-width sizing (2-WS) approximate an optimal wire sizing (OWS) with a plurality of wire widths in both delay and area, and achieve close to optimal performance under a fixed effective-fringing capacitance coefficient for the VLSI interconnect.

41. The method of claim 37, wherein the two-width sizing (2-WS) approximates an optimal global interconnect sizing and spacing (GISS) with a plurality of wire widths in both delay and area, and achieves close to optimal performance under a fixed pitch-spacing for the VLSI interconnect.

42. The method of claim 35, wherein the determining step further comprises planning the small number of globally optimal wire widths for the range of interconnect lengths.

43. The method of claim 42, wherein planning step further comprises finding at least one-width vector $\vec{W}$ with the small number of globally optimal wire widths for the range of interconnect lengths $l_{min}$ to $l_{max}$ such that an objective function:

$$\Phi(\vec{W}, l_{min}, l_{max}) = \int_{l_{min}}^{l_{max}} \lambda(l) \cdot f(\vec{W}, l) dl$$

is minimized, wherein $\lambda(l)$ is a weighting function for l, and $f(\vec{W}, l)$ is the objective function for an interconnect length l using $\vec{W}$.

44. The method of claim 43, wherein $f(\vec{W}, l) = A^j(\vec{W}, l) T^k(\vec{W}, l)$ with $A(\vec{W}, l)$ being an area using $\vec{W}$ and $T(\vec{W}, l)$ being a delay using $\vec{W}$ that provides an area-delay tradeoff in the objective function.

45. The method of claim 44, wherein j=1 and k=4 for an area-efficient performance optimization.

46. The method of claim 43, wherein $\vec{W}$ has one component W for one-width planning for the range of interconnect lengths.

47. The method of claim 43, wherein $\vec{W}$ has two components $W_1$ and $W_2$ for two-width planning for the range of interconnect lengths.

48. The method of claim 43, further comprising finding a best one-width planning, two-width planning, or wire-width planning with a small number of wire widths to minimize the objective function.

49. The method of claim 48, wherein the two-width planning achieves close to optimal performance in both delay and area for the range of interconnect lengths.

50. The method of claim 43, further comprising determining a maximum error $\delta_{max}$ using a weighting function $\lambda(l)$, wherein if $$\left| \frac{f(\vec{W}, l) - f(\vec{W}^*, l)}{f(\vec{W}^*, l)} \right| \leq \delta_{max} \text{ for any } l \in (l_{min}, l_{max})$$

then for the weighting function $\lambda(l)$:

$$\left| \frac{\Phi(\vec{W}, l_{min}, l_{max}) - \Phi(\vec{W}^*, l_{min}, l_{max})}{\Phi(W^*, l_{min}, l_{max})} \right| \leq \delta_{max}$$

and $\Phi(\vec{W}, l_{min}, l_{max})$ is an optimization metric for the interconnect lengths $l_{min}$ to $l_{max}$.

51. The method of claim 42, further comprising planning the small number of globally optimal wire widths for the range of interconnect lengths per metal layer of the VLSI interconnect to achieve near-optimal performance.

52. A very large scale integration (VLSI) interconnect generated using a method for wire width planning and performance optimization, wherein the method comprises:

(a) determining a small number of globally optimal wire widths for the VLSI interconnect in a range of interconnect lengths; and (b) generating an optimized layout for the VLSI interconnect using the small number of globally optimal wire widths.

53. The method of claim 52, wherein the determining and generating steps are guided by a metric including both area and delay for the VLSI interconnect.

54. The method of claim 52, wherein the determining and generating steps further comprise two wire sizing optimization schemes for the VLSI interconnect, including single-width sizing (1-WS) and two-width sizing (2-WS).

55. The method of claim 54, wherein the single-width sizing (1-WS) computes an optimal wire sizing (OWS) with a uniform wire width for the VLSI interconnect.

56. The method of claim 54, wherein the two-width sizing (2-WS) computes an optimal wire sizing (OWS) with two optimal wire widths together with a length for each of the two optimal wire widths for the VLSI interconnect.

57. The method of claim 54, wherein the single-width sizing (1-WS) and the two-width sizing (2-WS) approximate an optimal wire sizing (OWS) with a plurality of wire widths in both delay and area, and achieve close to optimal performance under a fixed effective-fringing capacitance coefficient for the VLSI interconnect.

58. The method of claim 54, wherein the two-,width sizing (2-WS) approximates an optimal global interconnect sizing and spacing (GISS) with a plurality of wire widths in both delay and area, and achieves close to optimal performance under a fixed pitch-spacing for the VLSI interconnect.

59. The method of claim 52, wherein the determining step further comprises planning the small number of globally optimal wire widths for the range of interconnect lengths.

60. The method of claim 59, wherein planning step further comprises finding at least one-width vector $\vec{W}$ with the small number of globally optimal wire widths for the range of interconnect lengths $l_{min}$ to $l_{max}$ such that an objective function:

$$\Phi(\vec{W}, l_{min}, l_{max}) = \int_{l_{min}}^{l_{max}} \lambda(l) \cdot f(\vec{W}, l) dl$$

is minimized, wherein $\lambda(l)$ is a weighting function for l, and $f(\vec{W}, l)$ is the objective function for an interconnect length l using $\vec{W}$.

61. The method of claim 60, wherein $f(\vec{W}, l) = A^j(\vec{W}, l) T^k(\vec{W}, l)$ with $A(\vec{W}, l)$ being an area using $\vec{W}$ and $T(\vec{W}, l)$ being a delay using $\vec{W}$ that provides an area-delay tradeoff in the objective function.

62. The method of claim 61, wherein j=1 and k=4 for an area-efficient performance optimization.

63. The method of claim 60, wherein $\vec{W}$ has one component W for the one-width planning for the range of interconnect lengths.

64. The method of claim 60, wherein $\vec{W}$ has two components $W_1$ and $W_2$ for two-width planning for the range of interconnect lengths.

65. The method of claim 60, further comprising finding a best one-width planning, two-width planning, or wire-width planning with a small number of wire widths to minimize the objective function.

66. The method of claim 65, wherein the two-width planning achieves close to optimal performance in both delay and area for the range of interconnect lengths.

67. The method of claim 60, further comprising determining a maximum error $\delta_{max}$ using a weighting function $\lambda(l)$, wherein if $$\left| \frac{f(\vec{W}, l) - f(\vec{W}^*, l)}{f(\vec{W}^*, l)} \right| \le \delta_{max} \text{ for any } l \in (l_{min}, l_{max})$$

then for the weighting function $\lambda(l)$:

$$\left| \frac{\Phi(\vec{W}, l_{min}, l_{max}) - \Phi(\vec{W}^*, l_{min}, l_{max})}{\Phi(W^*, l_{min}, l_{max})} \right| \le \delta_{max}$$

and $\Phi(\vec{W}, l_{min}, l_{max})$ is an optimization metric for the interconnect lengths $l_{min}$ to $l_{max}$.

68. The method of claim 59, further comprising planning the small number of globally optimal wire widths for the range of interconnect lengths per metal layer of the VLSI interconnect to achieve near-optimal performance.

* * * * *

UNITED STATES PATENT AND TRADEMARK OFFICE
CERTIFICATE OF CORRECTION

PATENT NO.      : 6,408,427 B1
DATED           : June 18, 2002
INVENTOR(S)     : Jingsheng Cong and Zhigang Pan It is certified that error appears in the above-identified patent and that said Letters Patent is hereby corrected as shown below:

<u>Title page,</u>
Item [56], References Cited, OTHER PUBLICATIONS, "J. Cong et al., Global interconnect sizing and spacing etc.," "623" should read -- 628 --
"P. Fisher et al., The test of time etc.," "Magazines" should read -- Magazine --

Item [57], ABSTRACT,
Line 13, after "such" insert -- a --

<u>Column 14,</u>
Line 44, move open parenthesis "(" to Line 45
Line 44, insert a space before and after equals sign <u>Column 17,</u>
Line 42, move open parenthesis "(" to Line 43
Line 42, insert spaces before and after equals sign <u>Column 18,</u>
Line 53, strike second occurrence of comma <u>Column 19,</u>
Line 10, move open parenthesis "(" to Line 11
Line 10, insert spaces before and after equals sign Signed and Sealed this Twelfth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,408,427 B1
DATED : June 18, 2002
INVENTOR(S) : Jingsheng Cong and Zhigang Pan It is certified that error appears in the above-identified patent and that said Letters Patent is hereby corrected as shown below:

Column 15,
Line 35, "VISI" should read -- VLSI --.

Signed and Sealed this

Twenty-seventh Day of January, 2004

JON W. DUDAS
*Acting Director of the United States Patent and Trademark Office*